US 8,521,927 B2

(12) United States Patent
Hirshberg (10) Patent No.: US 8,521,927 B2
(45) Date of Patent: Aug. 27, 2013

(54) SYSTEM AND METHOD FOR TEXT ENTRY

(76) Inventor: David Hirshberg, Haifa (IL)

( * ) Notice: Subject to any disclaimer, the term of this patent is extended or adjusted under 35 U.S.C. 154(b) by 254 days.

(21) Appl. No.: 11/774,578

(22) Filed: Jul. 7, 2007

(65) Prior Publication Data
US 2009/0009367 A1 Jan. 8, 2009

(51) Int. Cl.
*G06F 13/12* (2006.01)
*G06F 13/38* (2006.01)
(52) U.S. Cl.
USPC ................. 710/67; 710/73; 715/746; 400/89; 400/100
(58) Field of Classification Search
USPC .......................................................... 710/67
See application file for complete search history.

(56) References Cited

U.S. PATENT DOCUMENTS

| 5,818,437 A | 10/1998 | Grover et al. | |
|---|---|---|---|
| 5,847,697 A | 12/1998 | Sugimoto | |
| 5,959,629 A * | 9/1999 | Masui | 715/808 |
| 6,597,345 B2 * | 7/2003 | Hirshberg | 345/168 |
| 7,149,550 B2 * | 12/2006 | Kraft et al. | 455/566 |
| 2002/0183100 A1 * | 12/2002 | Parker | 455/566 |
| 2003/0067445 A1 | 4/2003 | Hirshberg | |

OTHER PUBLICATIONS

Daniel Wigdor and Ravin Balakrishnan, "TiltText: Using tilt for text input to mobile phones", Proceedings of UIST 2003—ACM Symposium on User Interface Software and Technology. p. 81-90, 2003.
Wigdor et al. "TiltText: Using Tilt for Text Input to Mobile Phones", Proceedings of the UIST 2003—ACM Symposium on User Interface Software and Technology, p. 81-90, 2003.

* cited by examiner

*Primary Examiner* — Henry Tsai
*Assistant Examiner* — Dean Phan (57) ABSTRACT

A text entry system for an electronic device comprising:
an input subsystem receives user input operations, interprets them as letters, characters, symbols, commands or functions, where the said received user operations interpreted as letters are comprising:
(1) single letter operations that select any possible letter from the alphabet,
(2) letter group operations that select a group of possible letters from the alphabet; and
a text prediction subsystem receives a sequence of the said single letter entries and letter group entries, and produces a list of possible words the user intends to enter based on a priori database of words; and
a word processing subsystem, receives the said list of possible words, displays them to the user, receives the user selection of the desired word and further processes the text entry as required.

29 Claims, 4 Drawing Sheets

SYSTEM AND METHOD FOR TEXT ENTRY

FIELD AND BACKGROUND OF THE INVENTION

Text entry is one of the crucial issues for third generation cellular phones as well as for other compact hand held wireless communication devices.

Many methods have been suggested in recent years. Among the most popular ones are methods that reduce the number of keys by grouping several letters together on the same key and use a prediction or disambiguating system to generate the desired text. Since fewer keys are needed, smaller keypad size or larger key size is obtainable. Less finger movements are needed hence typing speed is potentially increased. However, if the user desires to write a word that is not in the device's dictionary database, or if more than one valid word exists for a sequence of letter entries, a considerable degradation in typing speed and comfort occurs.

In U.S. Pat. No. 5,818,437 entitled "reduced keyboard disambiguating computer", Grover, et al., a 3 by 4 numeric keypad is presented where each key is associated with 3 or 4 letters. In U.S. Pat. No. 5,847,697 entitled "Single-handed keyboard having keys with multiple characters and character ambiguity resolution logic", Sugimoto, a half size QWERTY keyboard, with two letters associated to most of the keys, is presented. Much more prior art exists for similar arrangements, as well as various implementations of text prediction or disambiguation processing.

Several ways to present the words list to the user as well as receiving the user selection of the desired word, including word a completion feature, are also available in prior art.

None of the prior art combines the predictive text method together with simple single letter text entry into one unified text entry system.

The current invention offers a way of combining predictive text with a simple single letter text entry using several arrangements such as multi-functional keys to form a family of new text entry systems that takes the best features from both methods.

SUMMARY OF THE INVENTION

There is thus provided, in accordance with some preferred embodiments of the present invention, text entry system for an electronic device, the system comprising:

an input subsystem receives user input operations, interprets the said input operations as letters, characters, symbols, commands or functions, where the said received user operations interpret as letters are comprising: (1) single letter operations that select any possible letter from the alphabet, (2) letter group operations that select a group of possible letters from the alphabet; and (b) a text prediction subsystem receives a sequence of the said single letter entries and letter groups entries, and produces a list of possible words the user intends to enter based on a priori database of words; and (c) a word processing subsystem, receives the said list of possible words, displays the said list to the user, receives the user selection of the desired word and further processes the text entry as required.

Furthermore, in accordance with some preferred embodiments of the present invention, the said input subsystem comprising of keypad with keys and some of the keys are used for entering the said single letter operations and some other keys are used for entering a letter group operation.

Furthermore, in accordance with some preferred embodiments of the present invention, one or more of the said keys are push button keys.

Furthermore, in accordance with some preferred embodiments of the present invention, one or more of the said keys are touch sensitive keys on a touch sensitive surface or a touch sensitive screen.

Furthermore, in accordance with some preferred embodiments of the present invention, the said input subsystem comprising of keypad with keys and some of the keys are used for entering the said letter group operations and simultaneous key selection combinations of the said keys are used for entering a single letter operation.

Furthermore, in accordance with some preferred embodiments of the present invention, the said input subsystem comprising of keypad with keys and some of the keys are used for entering the said single letters operations and simultaneous key selection combinations of the said keys are used for entering a letter group operation.

Furthermore, in accordance with some preferred embodiments of the present invention, the said input subsystem interprets user gestures over a two-dimensional surface or over a three-dimensional space for single letter operations or letter group operations or both single letter and letter group operations.

Furthermore, in accordance with some preferred embodiments of the present invention, some of the said keys key area is arranged in nested arrangement and the nesting key activation is interpreted as a letter group operation and the said group contains the letters of all the nested letter groups or single letters reside in the said nesting key.

Furthermore, in accordance with some preferred embodiments of the present invention, one or more of the said keys are multi-functional keys.

Furthermore, in accordance with some preferred embodiments of the present invention, one or more of the said multifunctional keys contain at least the functionality of two or more single letter selection functions and the functionality of a letter group selection function contains all single letter selection functions associated with the said key.

Furthermore, in accordance with some preferred embodiments of the present invention, the letter group operation is associated with press or touch operation on the said multifunctional key and the single letters operations associated with directional key activation such as slide, swipe or tilt or directional gesture applied to the said multifunctional key.

Furthermore, in accordance with some preferred embodiments of the present invention, the letter group operation is associated with press or touch operation on the said multifunctional key and the single letter operations associated with press or touch operation on the said multifunctional key accompanied with directional gesture of the said electronic device or directional gesture over other objects on the said electronic device.

Furthermore, in accordance with some preferred embodiments of the present invention, the selected letters in the letter group are dependant on the touch or press location on the key area.

Furthermore, in accordance with some preferred embodiments of the present invention, the said text prediction subsystem provides a sorted list of words based on alphabetical order or a priori frequency of the word in the language.

Furthermore, in accordance with some preferred embodiments of the present invention, the input subsystem provide together with the said letter group selection a probability of each letter in the group and the said text prediction subsystem receives the said probabilities and provides a sorted list of words based on a posteriori probability according to a weighting between the a priori frequency of the word in the language and the probability of the selection of each letter by the user.

Furthermore, in accordance with some preferred embodiments of the present invention, the said text prediction subsystem provides a list of words with a length longer then the length of the received sequence of single letters and letter group and the word processing subsystem enables the user to select the possible word completion.

There is thus provided, in accordance with some preferred embodiments of the present invention, a method for inputting text information into an electronic device using a user interface apparatus, the method comprising:

a user input operations, for letters, characters, symbols, commands or functions, where the said user operations for letters are further comprising:
(1) single letter operations that select any possible letter from the alphabet,
(2) letter group operations that select a group of possible letters from the alphabet; and a text prediction processor receives sequence of the said single letter entries and letter group entries, and produce a list of possible words the user intend to enter based on a priori database of words; and a word processing processor, received the said list of possible words, displays them to the user, and receives the user selection of the desired word from the said list.

Furthermore, in accordance with some preferred embodiments of the present invention, one or more of the said single letter input operations and one or more of the said letter group input operations are both key selection operations.

Furthermore, in accordance with some preferred embodiments of the present invention, one or more of the said input operations are pressing a push button key.

Furthermore, in accordance with some preferred embodiments of the present invention, one or more of the said input operations are touching a key on a touch sensitive surface or a touch sensitive screen.

Furthermore, in accordance with some preferred embodiments of the present invention, the said letter group operations are single key selections and the single letter operations are simultaneous selection of several keys.

Furthermore, in accordance with some preferred embodiments of the present invention, the said single letter operations are single key selections and the letter group operations are simultaneous selection of several keys.

Furthermore, in accordance with some preferred embodiments of the present invention, where the said input operations are user gestures over a two-dimensional surface or over three-dimensional space for single letter operations or for letter group operations or for both single letter and letter group operations.

Furthermore, in accordance with some preferred embodiments of the present invention, some of the said keys area arranged in nested arrangement and the nesting key selection performs a letter group operation and the said group contains the letters of all the nested letter groups or single letters reside in the said nesting key.

Furthermore, in accordance with some preferred embodiments of the present invention, one or more of the said keys are multi-functional keys.

Furthermore, in accordance with some preferred embodiments of the present invention, one or more of the said multifunctional key contain at least the functionality of two or more single letter selection functions and the functionality of a letter group selection function contains all single letter selection functions associated with the said key.

Furthermore, in accordance with some preferred embodiments of the present invention, the letter group operation is associated with a press or touch operation on the said multifunctional key and the single letter operations associated with directional key activation such as slide, swipe or tilt or directional gesture applied to the said multifunctional key.

Furthermore, in accordance with some preferred embodiments of the present invention, the letter group operation is associated with a press or touch operation on the said multifunctional key and the single letter operations are associated with a press or touch operation on the said multifunctional key accompanied by a directional gesture of the said electronic device or directional gesture over other objects on the said electronic device.

Furthermore, in accordance with some preferred embodiments of the present invention, the selected letters in the letter group are in accordance with the touch or press location on the key area.

Furthermore, in accordance with some preferred embodiments of the present invention, the list of possible words displayed is sorted in alphabetical order or in a priori frequency in the language order.

Furthermore, in accordance with some preferred embodiments of the present invention, the letter group input operation induces a selection probability for each letter in the letter group and the said text prediction processor receive the said probabilities and provide a sorted list of words based on a posteriori probability according to a weighting between the a priori frequency of the word in the language and the probability of the selection of each letter by the user.

Furthermore, in accordance with some preferred embodiments of the present invention, the said text prediction processor provides a list of words with lengths longer then the length of the received sequence of single letters and letter groups and the user can select the possible word completion.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention describes a text entry system for electronic devices. Prior art teaches us either a "single-letter" text entry system or "predictive-text" text entry system.

"Single-letter" text entry system is the classic full keyboard arrangement with input operations that select a single unique letter from the alphabet in each step. We define this operation as "single-letter" operation.

"Predictive-text" text entry system is a reduced keyboard arrangement with input operations that select groups of letters form the alphabet in each input operation step. In predictive-text text entry, the input operation step is followed by a process that solves the ambiguity of the actual word the user intended to enter. The input operation in the predictive-text text entry system is defined as "letter group" operation.

In some cases, a device may contains both "predictive-text" text entry system and a "single-letter" text entry system available in the same device, however in order to use both methods the user needs to switch between those two modes of operation. Such an operation is usually cumbersome and consumes a considerable amount of time.

The current innovation combines the two types of text entry methods into one unified text entry system. The user can select the type of text entry method he wants to use in every letter entry step. There is no need to switch between modes or to pay any penalty when switching between "single-letter" and "letter group" input operations. The motivation to unify these two different text entry methods is to gain the best of both worlds.

On the one hand, predictive text methods have reduced the number of input operations and hence have a potential for smaller sized devices and faster text entry speeds. The main drawback of predictive text method stems from the fact that the ambiguity solving subsystem has non-negligible probability of not guessing the desired word in the first guess or even not guessing it at all, if the word does not exist in the database. When such an event occurs the text entry speed is reduced dramatically, not to mention the discomfort the user experiences. Single-letter text entry, on the other hand, is very natural, comfortable and precise, but usually takes more space to implement. If, in spite of that limitation, a reduced size keyboard is used, it becomes more difficult, uncomfortable and slower to use.

Combining the two text entry methods together enables the user to make the method selection tradeoff on a letter-by-letter or a word-by-word basis. In the present innovation, common words that are well handled by predictive text methods will typically be entered using "letter group" operations, while more scarce words will be entered by a mixture of "letter group" and "single letter" operations, and finally names, abbreviations and slang will typically be entered by "single letter" operations exclusively.

In a compact hand held device "single letter" input operation takes up a lot of space and slows down text entry. However, we will see in the following embodiments many arrangements where those operations can be implemented with considerably little overhead over the plain predictive text, letter-group-only counterpart keyboards.

Figure 1:
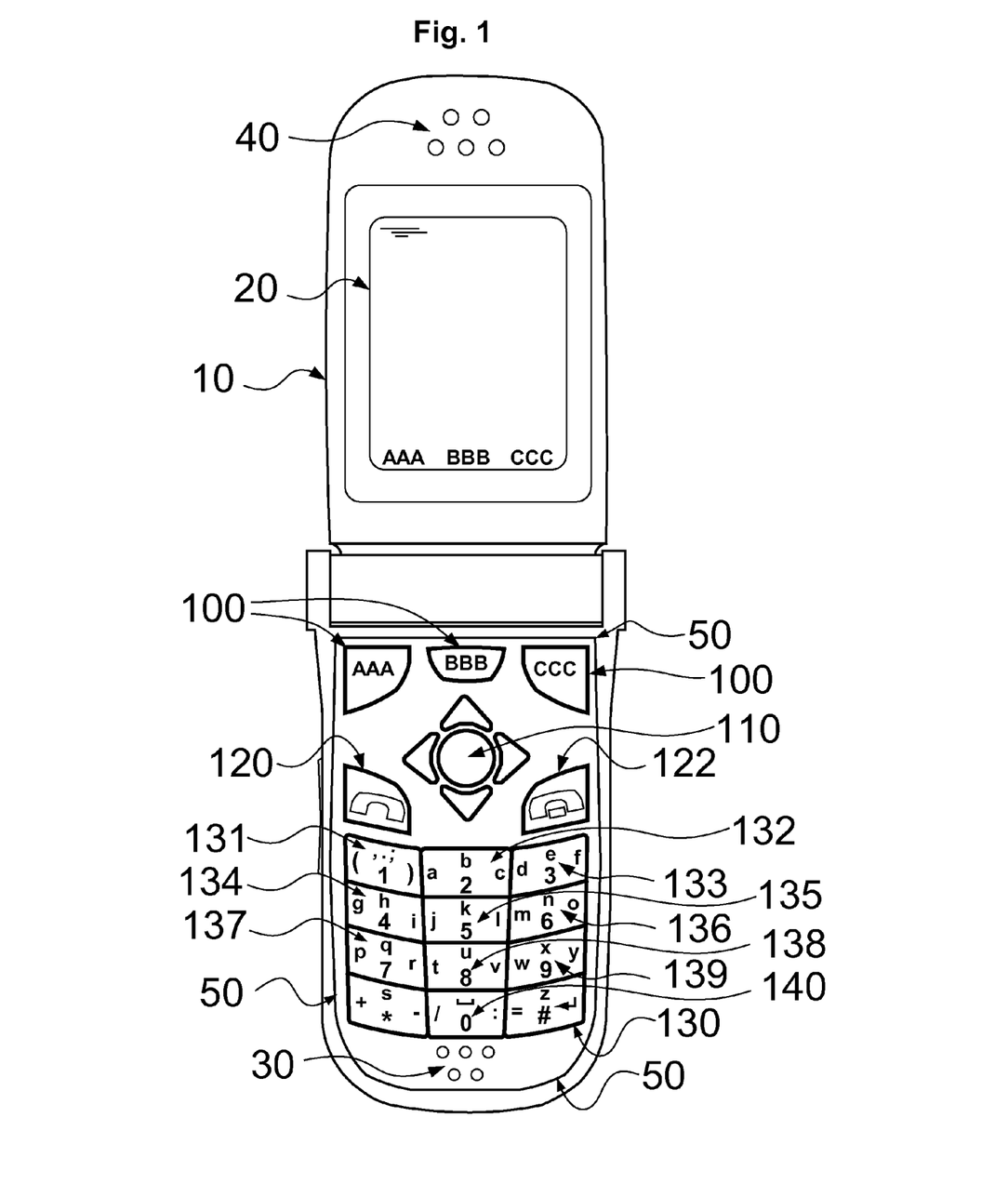
FIG. 1 is a front view of a shell style cell-phone, in accordance with a preferred embodiment of the invention.

Reference is now made to FIG. 1, which is a typical shell style cell-phone implementing a preferred embodiment of the invention. This cellular phone includes a shell style case 10, a display 20, a speaker and a microphone, 30 and 40 respectively, and several push button keys including: three menu selection keys 100, five navigation & selection keys 110, call answer key 120, call end key 122 and a twelve key mechanical push button numeric keypad 130. In addition, the cell phone includes a touch sensitive surface under the keypad face. The touch sensitive surface area is designated by its boundary 50.

In the current embodiment text entry is preformed by either press operations or swipe operations over the numeric keypad 130. A press on keys 132-139 is interpreted as a letter group operation. For example, key 132 press corresponds to the letter group 'a' 'b' and 'c', key 133 corresponds to the letter group 'd' 'e' and 'f', etc. A swipe operation on the other hand is interpreted as a single letter operation so a swipe to the left starting over key area 132 is interpreted as typing the letter 'a' while swipe to the right starting over key area 132 is interpreted as typing the letter 'c', etc. Overall, keys 132-139 cover all Latin alphabet both in group operations by a press type operation and with single letter selection by a swipe type operation.

The user is able to decide for each letter whether to select a letter group operation or to select a single letter operation. Typically, a single letter operation will be a slower or more complex operation. The user trades between text entry speed and comfort versus the amount of ambiguity. Too much ambiguity eventually takes additional effort and time in order to select the proper word from the list of possible words.

For example, let's take the following typing sequence:
(1) press key 138 (8,t,u,v),
(2) press key 134 (4,g,h,i),
(3) press key 133 (3,d,e,f)

The text prediction subsystem software searches the database for valid words. The possible valid words are 'the' or 'tie' or 'vie'. The number '843' might also be a valid input option. Since 'the' is the a priori most probable word, it will be at the top of the list and pressing on space, key 140, will automatically select the word 'the' followed by a space.

If the user wants to enter the word 'vie' without explicitly select it from the possible words list, knowing that this is not a popular word, the user can enter the following sequence:
(1) swipe to the right, starting over key 138 (v),
(2) press key 134 (4,g,h,I),
(3) press key 133 (3,d,e,f)

In this way only words that start with the letter 'v' will be searched on the database and the word 'vie' will be the only valid word shown on the words list. Pressing on space, key 140, will automatically select, in this case, the word 'vie' followed by a space to the text field.

If the user wants to enter the number '843', he needs to start with explicit digit entry by swipe downward, starting over key 138 (8). In this case, next press operations will be interpreted as digits until a non-digit character selection is made. For example, a swipe upwards on key 140 (space) will terminate the numeric entry mode.

Figure 2:
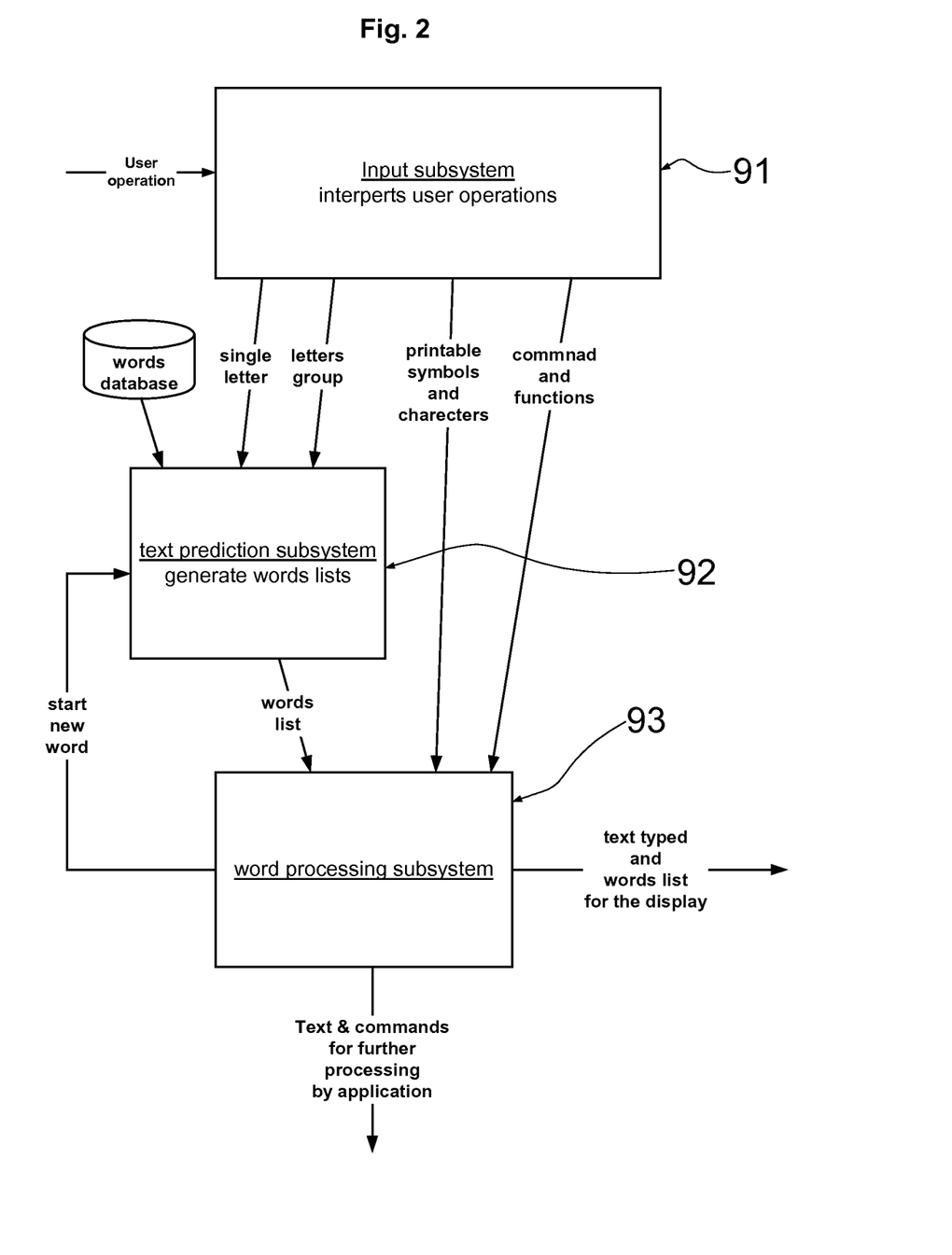
FIG. 2 is a simplified block diagram of the implementation of the text entry system, in accordance with a preferred embodiment of the invention.

Reference is now made to FIG. 2 were a typical flow chart of the preferred embodiment text entry system processing is shown. The system is split to three subsystems: (a) the input subsystem 91; (b) the text prediction subsystem 92; and (c) the word processing subsystem 93. Each time the user makes an input operation on the device, the input subsystem 91 receives the user actions.

In the embodiment shown in FIG. 1, the input operations include a key contact engage or release, and a finger touch start, move or lift-up with the corresponding finger location measurements from the touch-sensing surface. The input subsystem 91 interprets the user operations and classifies them to one of the four categories: (1) letter group selection, (2) single letter selection, (3) other symbols or characters selection, and (4) command or function selection. The first two categories are sent to the text prediction subsystem 92.

Each time the text prediction subsystem 92 gets a new letter or letter group, it updates the list of possible words, based on the sequence history of single letters and letter groups provided by the user starting from the first letter typing of the word. The updated word list is sent to the word processing subsystem 93. Text prediction subsystems 92 are well known in the art and the current innovation can be implemented using these different kinds of text prediction subsystems including such subsystems that have learning algorithms to adapt to user preference and those that update the database with new words used by the user.

The word processing subsystem 93 sends the current text and if adequate, the word list to the display. In addition, if the user enters a non-letter, such as punctuation, symbol, or a command for word selection from the word list, the word processing subsystem 93 updates the display, resets the text prediction subsystems 92 to be ready for reception of a new word, updates and sends the appropriate text field for further processing by the application. Word processing subsystems 93 are also well known in the art and this innovation can be used with many different ways of displaying and selecting the word list as well as using word completion feature to further increase typing speed.

Due to the ability to make specific letter selection on each location, the user can dynamically control the length of the word list to enhance usability of features such as word completion.

Figure 3:
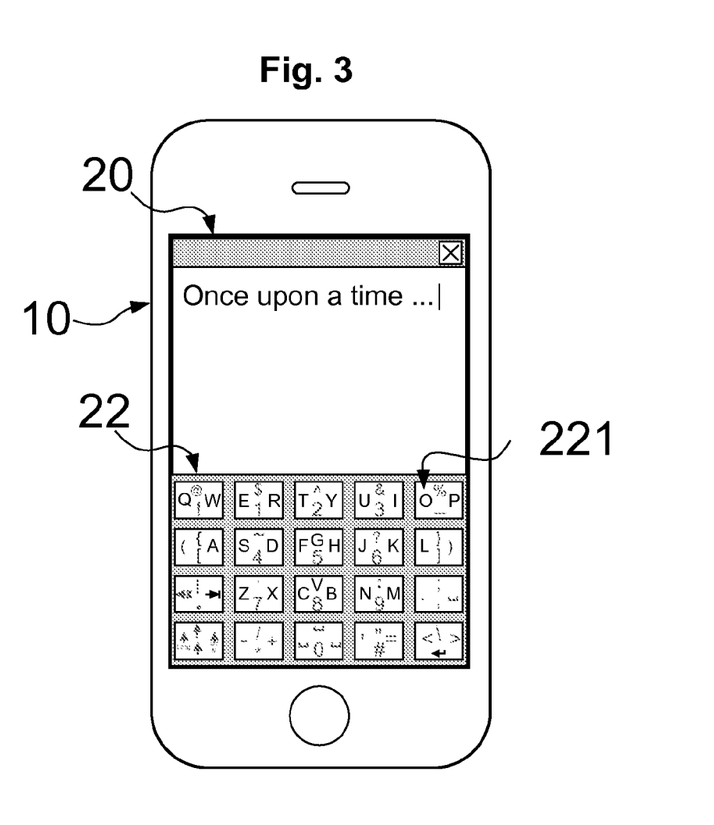
FIG. 3 is a front view of a PDA device, in accordance with a preferred embodiment of the present invention.

Reference is now made to FIG. 3, which presents a typical PDA device. The PDA includes a case 10, and a touch sensitive display 20. On the touch sensitive display 20 a keypad area 22 is displayed when text entry is required. This keypad uses multi-functions keys and the text entry method disclosed in patent U.S. Pat. No. 6,597,345 to Hirshberg, 22 Jul. 2003. The keyboard is designed such that the letters are located according to the well-known QWERTY keyboard.

Taking for example key 221, touching the key 221 will be interpreted as a letter group that include the letters {'o','p'}, while touching on keys 221 then swipe the finger to the left or to the right will be interpreted as single letterer 'o' and 'p' respectively. All other Latin letters can be selected by the other keys in the keypad either as groups with touch operation or the specific single letter with the proper directed swipe operation.

While the embodiments described in the above paragraphs deals with the combination of letter group selection done by a simple push button key, mechanical or touch sensitive, and single letter selection done by directional activation of the keys using a touch sensitive surface or screen, it is maintained that providing a combination of any type of simple activation of keys to select letter groups, with more complex directional activation of the said keys to select the specific letters, is a straight forward extension of the embodiments described and is definitely covered by the scope of the present invention.

An example of another two such straight forward extensions is the use of joystick type mechanical keys disclosed in US Patent Application No. 20030067445 entitled "REMOTE KEYPAD", Hirshberg et al., and the use of device tilting disclosed in paper of Daniel Wigdor and Ravin Balakrishnan (2003) "TiltText: Using tilt for text input to mobile phones" *Proceedings of UIST* 2003—*ACM Symposium on User Interface Software and Technology.* p. 81-90.

Figure 4:
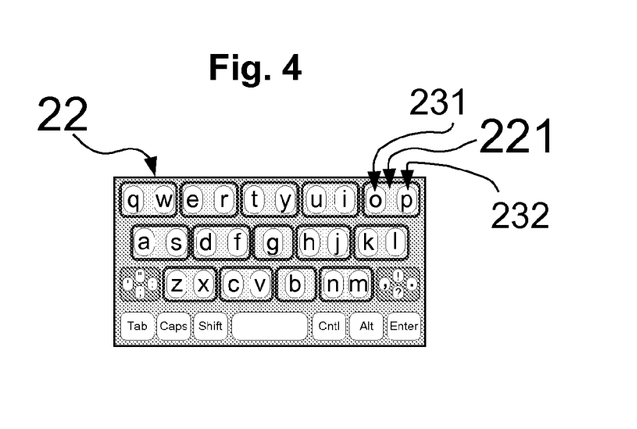
FIG. 4 is a front view of alternative keypad arrangement for the PDA device shown in FIG. 3, in accordance with a preferred embodiment of the invention.

Reference is now made to FIG. 4, which presents another possible embodiment over PDA devices. The keypad area 22 on the touch sensitive display 20 is displayed when text entry is required.

It is a well known fact that the movement time between keys obeys Fits' law, i.e., $MT=a+b \times \log_2(A/W+1)$, where MT is the predicted movement time, A is the distance between key centers and W is the average width of the key. The coefficients a and b are found by experiments. Following Fits' law one way to reduce the finger movement time is to make the keys bigger.

In this QWERTY like keyboard embodiment most letters are grouped into pairs creating a wider "letter group" keys that gives the user the choice to either make a single letter selection by accurately touching the key letter location or by selecting a two letter group by touching on the middle of the bigger key surrounding the two letters. For example key 221 contains two smaller keys 231 and 232. If the user touches the area of key 231 the letter 'o' is selected. If the user touches the area of key 232 the letter 'p' is selected. If the user touches the area in key 221 that is not inside the area of keys 231 and 232 then the group {'o','p'} is selected.

Further extension of this embodiment includes an input subsystem that can also distinguish between single letters operation and letter group operation using the amount of pressure used to select the key, the speed of press etc.

Figure 5:
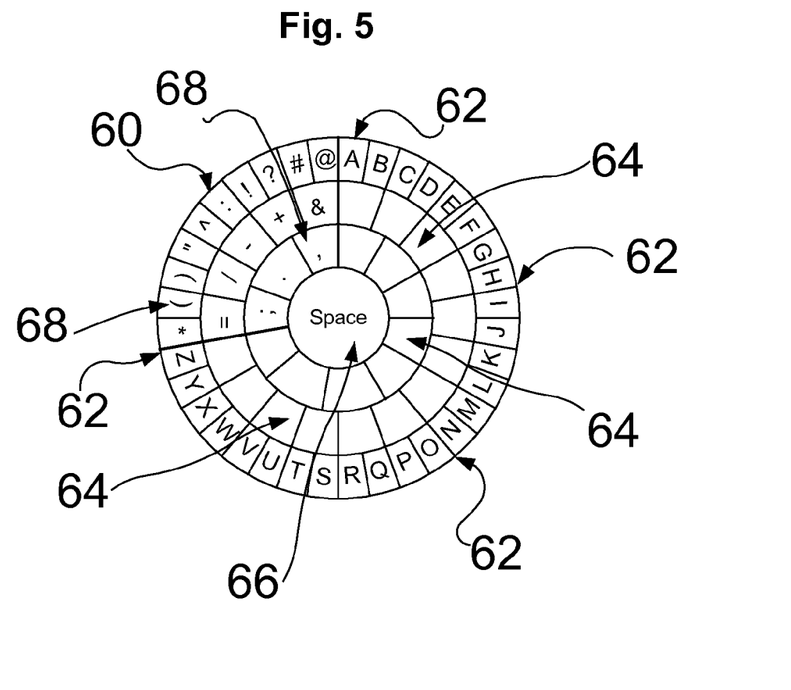
FIG. 5 is a front view of a disk shaped keypad, in accordance with a preferred embodiment of the present invention.

Reference is now made to FIG. 5, which presents another possible embodiment were the input device is a touch sensitive surface 60 shaped as a disk. Four different areas are located in this touch sensitive surface 60. The outer ring in the quarter I, III and IV 62, contains keys for single letter selection from A to Z. the area of the two inner rings in quarter I, III, and IV 64, are used for letter group keys. The ring closer to ring 62 contains keys that select two successive letters in each group, while the ring closer to the center of the disk contains keys that select three successive letters in each group. The center disk 66 is the space key. The area of the rest of the disk 68 that resides on quarter II of the disk contains keys for all other punctuations and symbols needed for text entry.

This keyboard arrangement demonstrates the main idea behind this innovation. While the space key is the most frequently used in the language and is kept in the middle, the user can trade between speed, i.e. movement distance and ambiguity factor. A small movement selects groups of 3 letters, hence contains larger ambiguity, larger movements select groups of two letters which is less ambiguous, and the most costly i.e. slower, but not ambiguous, is to select a single letter key in the outer ring.

Figure 6:
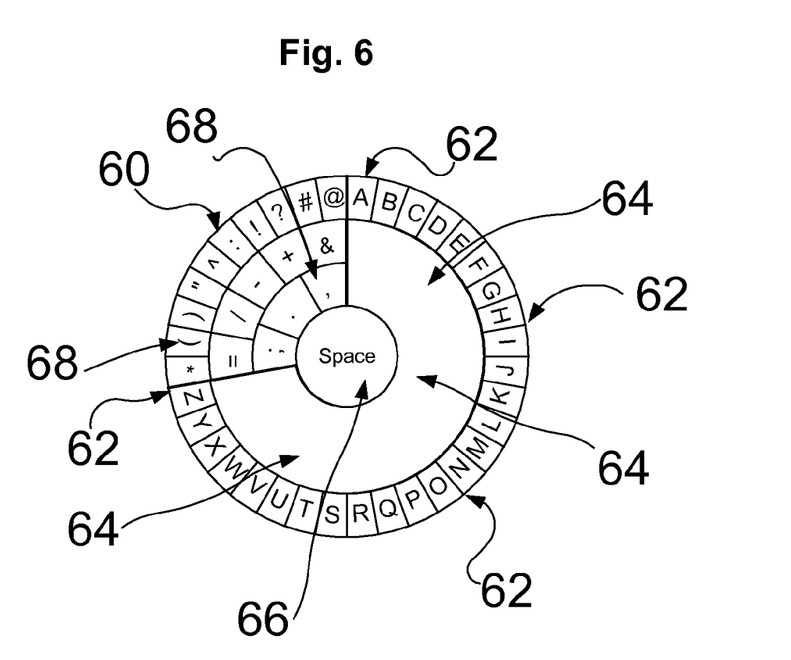
FIG. 6 is a front view of another disk shaped keypad, in accordance with a preferred embodiment of the present invention.

Reference is now made to FIG. 6, which shows another embodiment similar to the previous embodiment shown in FIG. 5. While areas 62, 66 and 68 contain the same keys and functionality as in previous embodiment, area 64 does not contain any key. Touching this area still selects a letter group, but the actual letters in the group are selected according to the exact location of the touch on the area 64.

Further more this embodiment reveals the concept of having a probability associated with each letter on the group. Associating a probability for a letter in a group to a text prediction subsystem is not novel and had been thought by U.S. Pat. No. 6,801,190 entitled "Keyboard System with Automatic correction" by Robinson et el. However, while Robinson used this feature for error correction, in the context of this innovation this feature is used for explicit trading between typing speed and ambiguity removal.

A demonstration of one possible way to encode the touch position in area 64 to a probabilistic letter group is given in the following formulas: Taking the normalized outer radius to be 1, the space key radius to be 0.4, the outer key ring 62 inner radius to be 0.8 and the touch position is the pair $(r,\theta)$. For any letter, l, between l=1 (A) to l=26 (Z), the key center angle $\theta(l)$ is $\Theta(l)=(10*l-5)/2\pi$ [rad].

For each letter index l, $P^*(l)=\exp(-(\theta-\Theta(l))^2/(1-r)^2)$ For each l* that $P^*(l)$>threshold (=0.1) the letter is entered to the letter group.

The letter probability equals to $P(l^*)=P^*(l^*)/\Sigma_{k \in l^*} P^*(k)$

Using this formula provide a probability for each letter in the group which is relative to the distance from the touch point to the letter key. Moreover, when the touch point is closer to the space key, more letters are selected to the group.

To demonstrate that, the outcome of the formula is given for four different touch points:

$(r,\theta)=(0.8, 10 \text{ deg.})=>\{(A,0.5),(B,0.5)\}$ (1)

$(r,\theta)=(0.6, 25 \text{ deg.})=>\{(B,0.24),(C,0.52),(D,0.24)\}$ (2)

$$(r,\theta)=(0.6, 37 \text{ deg.})=>\{(B,0.18),(D,0.5),(D,0.32)\} \quad (3)$$

$$(r,\theta)=(0.4, 70 \text{ deg.})=>\{(E,0.04),(F,0.15),(G,0.31),(H,0.31),(I,0.15)(J,0.04)\} \quad (4)$$

While the embodiments described herein with reference to the accompanying figures deal with the more common user input operation like key press, a straightforward extension of the embodiments is to use other types of input operation like chording simultaneously several keys, using many kinds of gestures with or without additional devices etc. It will be appreciated by persons skilled in the art that the present invention is not limited to what has been particularly shown and described hereinabove rather, the scope of the present invention includes many combinations and sub-combinations of various user input operations and various methods to partition them to single letter and letter group operations. The present invention also includes variation and modification thereof that are not in prior art, which would occur to persons skilled in the art upon reading the foregoing description.

What is claimed is:

1. A text entry system for an electronic device, the system comprising:
   (a) an input subsystem configured to receive user input operations, and interpret the input operations as letters, characters, symbols, commands or functions, wherein said input subsystem is configured to recognize as a letter entry input operations only keystrokes performed on a plurality of keys, wherein each of the letter entry input operation is a single keystroke performed on a single key and each said letter entry input operation is interpreted as a single letter location entry, wherein a single letter location is entered by one and only one said letter entry input operation and wherein said letter entry input operations for each said single letter location entry is comprising both either (1) single letter operations that select any possible letter from the alphabet, or (2) letter group operations that select a group of possible letters from the alphabet, and wherein the plurality of keys comprises single letter keys for the single letter operations and group letter keys for the letter group operations;
   (b) a text prediction subsystem which receives a sequence including both of said single letter operations and of said letter groups operations, and produces a list of possible words based on an a priori database of words, wherein said text prediction allows any operation of said sequence to be a single letter operation or a letter group operation, wherein said text prediction subsystem operates by searching said database for words which have letters that match letters entered by said single letter operations and resolve the ambiguity of letter groups entered by said letter group operations; and
   (c) a word processing subsystem, which receives said list of possible words, displays said list to the user, receives a user selection of a desired word and provides the desired word as a text entry for further processing.

2. A system according to claim 1, wherein said input subsystem is configured to use a single keystroke to identify a particular letter from a plurality of predefined letters and to identify a single letter group from a plurality of predefined letter groups.

3. A text entry system according to claim 2, wherein said keystroke comprises touching, pressing, moving, swiping, titling, sliding or performing any other gesture, movement or displacement over a key which forms part of a multi-key arrangement.

4. A text entry system according to claim 3, wherein one or more of keys of said multi-key arrangement are push button keys.

5. A text entry system according to claim 3, wherein one or more of keys of said multi-key arrangement are touch sensitive keys on a touch sensitive surface or a touch sensitive screen.

6. A text entry system according to claim 5, wherein some of said keys are arranged in a nested arrangement wherein smaller keys are located inside larger keys, and the larger keys' activation are interpreted as said letter group operations wherein said letter group operations contain all the letters that would be selected by all the smaller keys that reside inside said larger keys.

7. A text entry system according to claim 2, wherein said input subsystem interprets two-dimensional or three-dimensional user gestures over an input device keys as single letter operations or both as single letter and letter group operations.

8. A text entry system according to claim 3, wherein one or more of keys of said multi-key arrangement are multifunctional keys.

9. A text entry system according to claim 8, wherein one or more of said multifunctional keys contain at least the functionality of two or more said single letter operations and the functionality of a letter group operation contains the selection of all letters selected by the single letter operations associated with said multifunctional key.

10. A text entry system according to claim 9, wherein the letter group operations are associated with press or touch operations on said multifunctional key and the single letter operations are associated with a directional key activation comprising moving, sliding, swiping, tilting or any other directional gesture applied to said multifunctional key.

11. A text entry system according to claim 9, where the letter group operations are associated with press or touch operations on said multifunctional key and the single letter operations are associated with press or touch operations on said multifunctional key accompanied with directional gesture of said electronic device or directional gesture over other objects on said electronic device.

12. A text entry system according to claim 8, wherein the selected letters in one or more said letter group operation are recognized in accordance with the location of the touch or the press on said multi-key arrangement.

13. A text entry system according to claim 1, wherein said database of words are words of a language and wherein said text prediction subsystem provides a sorted list of words based on alphabetical order or a priori frequency of the word in the language.

14. A text entry system according to claim 1, wherein said database of words are words of a language and wherein said input subsystem provides together with a letter group entries, a probability of each letter in the letter group entry and said text prediction subsystem receives the probabilities and provides a sorted list of words based on a posteriori probability according to a weighting between the a priori frequency of the word in the language and the probability of the selection of each letter in the letter group entry.

15. A text entry system according to claim 1, wherein said text prediction subsystem provides a list of words with lengths longer than the length of the received sequence of single letter entries and letter group entries.

16. A method of text entry for an electronic device, comprising:
   (a) receiving from a user a sequence of keystrokes from a plurality of keys of said electronic device;

(b) identifying, by said electronic device, a plurality of said keystrokes as letter entry input operations, wherein each said letter entry input operation is a single keystroke performed on a single key and each said letter entry input operation is interpreted as a single letter location entry, and wherein a single letter location is entered by one and only one said letter entry input operation and wherein each said letter entry input operations for each said single letter location entry is identified as either a letter group operation that selects a group of possible letters from the alphabet or as a single letter operation that selects a single letter from the alphabet, and wherein the plurality of keys comprises single letter keys for the single letter operations and group letter keys for the letter group operations;

(c) generating, by said electronic device, at least one predicted text entry based on said sequence, using both single letter operations and letter group operations for predicting a single letter location entry, wherein said text prediction allows any operation of said sequence to be a single letter entry operation or a letter group operation, wherein said predicted text entry is performed by searching in an a priory database of words for words which have letters that match letters entered by said single letter operations and resolve the ambiguity of letter groups entered by said letter group operations; and (d) displaying, on said electronic device, said at least one predicted text entry.

17. A method according to claim 16, wherein said keystroke comprises touching, pressing, moving, swiping, titling, sliding or performing any other gesture, movement or displacement over a key which forms part of an arrangement of a plurality of keys.

18. A method according to claim 17, wherein one or more of said keystrokes includes pressing a push button key.

19. A method according to claim 17, wherein one or more of said keystrokes includes touching a key on a touch sensitive surface or a touch sensitive screen.

20. A method according to claim 19, wherein some of said keys are arranged in a nested arrangement wherein smaller keys are located inside larger keys, and an activation of larger keys is interpreted as a letter group entry and wherein said letter group entry contains all the letters that would be selected by all the smaller keys that reside inside the larger keys.

21. A method according to claim 16, wherein said keystrokes are two-dimensional or three-dimensional user gestures over an input device for inputting single letter operations or for inputting both single letter and letter group operations.

22. A method according to claim 17, wherein one or more of said keys are multifunctional keys.

23. A method according to claim 22, wherein one or more of said multifunctional keys contain at least the functionality of two or more said single letter entries and the functionality of a letter group entry contains the selection of all letters selected by the single letter user input operations associated with said multifunctional key.

24. A method according to claim 23, wherein the letter group operations are associated with press or touch operations on said multifunctional key and the single letter operations are associated with a directional key activation comprising moving, sliding, swiping, tilting or any other directional gesture applied to said multifunctional key.

25. A method according to claim 23, wherein said identifying comprises identifying as a letter group entry keystrokes associated with press or touch operations on said multifunctional key and identifying as a single letter entry keystrokes associated with press or touch operations on said multifunctional key and including a directional gesture of said electronic device or directional gesture over other objects on said electronic device.

26. A method according to claim 22, wherein the selected letters in one or more said letter group entries are identified in accordance with the location of the touch or the press on said key area.

27. A method according to claim 16, wherein said database of words are words of a language and wherein the at least one predicted entry comprises a list of words sorted in alphabetical order or in an order based on the a priori frequency in the words in the language.

28. A method according to claim 16, wherein said database of words are words of a language and comprising providing a selection probability for each letter in a letter group entry and wherein said generating comprises generating a sorted list of words based on a posteriori probability according to a weighting between the a priori frequency of the word in the language and the probability of the selection of each letter in a letter group entry.

29. A method according to claim 16, wherein said generating comprises generating a list of words with lengths longer than the length of the received sequence.

* * * * *